(12) United States Patent
Kim et al.

(10) Patent No.: US 10,497,904 B2
(45) Date of Patent: Dec. 3, 2019

(54) DISPLAY DEVICE

(71) Applicant: LG CHEM, LTD., Seoul (KR)

(72) Inventors: Hyun Suk Kim, Daejeon (KR); Se Woo Yang, Daejeon (KR); Hyun Jee Yoo, Daejeon (KR); Hyun Hee Son, Daejeon (KR); Jung Ok Moon, Daejeon (KR); Hyoung Sook Park, Daejeon (KR); Ban Seok Choi, Daejeon (KR); Jung Woo Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/747,073

(22) PCT Filed: Mar. 7, 2017

(86) PCT No.: PCT/KR2017/002424
§ 371 (c)(1),
(2) Date: Jan. 23, 2018

(87) PCT Pub. No.: WO2017/155266
PCT Pub. Date: Sep. 14, 2017

(65) Prior Publication Data
US 2018/0366684 A1 Dec. 20, 2018

(30) Foreign Application Priority Data

Mar. 8, 2016 (KR) .................. 10-2016-0027595

(51) Int. Cl.
*H01L 51/52* (2006.01)
*C09D 4/06* (2006.01)
(Continued)

(52) U.S. Cl.
CPC ...... *H01L 51/5281* (2013.01); *C08G 18/6229* (2013.01); *C08G 18/72* (2013.01);
(Continued)

(58) Field of Classification Search
CPC ........................... H01L 51/5281; G02B 1/115
See application file for complete search history.

(56) References Cited

U.S. PATENT DOCUMENTS

| 2004/0051445 A1* | 3/2004 | Adachi | ................ G02B 5/3016 |
| | | | 313/504 |
| 2008/0044674 A1* | 2/2008 | Inoue | ...................... B32B 27/00 |
| | | | 428/480 |

(Continued)

FOREIGN PATENT DOCUMENTS

| JP | 07-335134 A | 12/1995 | |
| JP | H7-335134 | * 12/1995 | .............. H01J 11/02 |

(Continued)

OTHER PUBLICATIONS

Machine translation, Yoshii, Japanese Pat. Pub. No. JP 2004-063303, translation date: May 4, 2019, Espacenet, all pages. (Year: 2019).*

(Continued)

*Primary Examiner* — Victoria K. Hall
(74) *Attorney, Agent, or Firm* — Dentons US LLP

(57) ABSTRACT

The present application relates to a display device. The present application can provide a display device in which reflection of external light is reduced to improve a contrast ratio. Such a display device can be applied to not only OLED, a self-luminous display device, but also various display devices including LCD, a non-self-luminous display device, and the like, and can be also implemented as a flexible display device.

18 Claims, 5 Drawing Sheets

(51) Int. Cl.

| | | |
|---|---|---|
| *C09D 5/00* | (2006.01) | |
| *C09J 133/08* | (2006.01) | |
| *C09J 11/06* | (2006.01) | |
| *H01L 27/32* | (2006.01) | |
| *H01L 51/00* | (2006.01) | |
| *C09J 201/00* | (2006.01) | |
| *C09J 133/06* | (2006.01) | |
| *C09J 175/04* | (2006.01) | |
| *G02B 1/111* | (2015.01) | |
| *G02B 1/116* | (2015.01) | |
| *C08G 18/62* | (2006.01) | |
| *C08G 18/72* | (2006.01) | |
| *G02B 1/115* | (2015.01) | |
| *G02B 1/113* | (2015.01) | |

(52) U.S. Cl.
CPC .............. *C09D 4/06* (2013.01); *C09D 5/006* (2013.01); *C09J 11/06* (2013.01); *C09J 133/066* (2013.01); *C09J 133/08* (2013.01); *C09J 175/04* (2013.01); *C09J 201/00* (2013.01); *G02B 1/111* (2013.01); *G02B 1/116* (2013.01); *H01L 27/3244* (2013.01); *H01L 51/0097* (2013.01); *G02B 1/113* (2013.01); *G02B 1/115* (2013.01); *H01L 51/5253* (2013.01); *H01L 2251/5338* (2013.01); *H01L 2251/558* (2013.01)

(56) References Cited

U.S. PATENT DOCUMENTS

| | | | | |
|---|---|---|---|---|
| 2013/0273317 A1* | 10/2013 | Nakayama | ............... | G02B 1/11 428/141 |
| 2019/0237515 A1* | 8/2019 | Jung | ..................... | H01L 27/322 |

FOREIGN PATENT DOCUMENTS

| | | | | | |
|---|---|---|---|---|---|
| JP | 2001-159712 | | * | 6/2001 | ............... G02B 5/22 |
| JP | 2001-159712 | A | | 6/2001 | |
| JP | 2004-63303 | | * | 2/2004 | ............. H05B 33/04 |
| JP | 2004063303 | A | | 2/2004 | |
| JP | 2005-209651 | A | | 8/2005 | |
| JP | 2008-310286 | | * | 12/2008 | ............... G02B 1/11 |
| JP | 2008-310286 | A | | 12/2008 | |
| JP | 2009-259504 | | * | 11/2009 | ............. H01J 11/02 |
| JP | 2009-259504 | A | | 11/2009 | |
| JP | 2010027567 | A | | 2/2010 | |
| JP | 2011-512422 | A | | 4/2011 | |
| JP | 2011-512558 | A | | 4/2011 | |
| JP | 2012-053483 | A | | 3/2012 | |
| JP | 2014186351 | A | | 10/2014 | |
| KR | 10-2005-0076464 | | * | 7/2005 | ............. H05B 33/22 |
| KR | 1020050076464 | A | | 7/2005 | |
| KR | 1020080005612 | A | | 1/2008 | |
| KR | 20-2008-005612 | | * | 11/2008 | ................ F21S 2/00 |
| KR | 101106294 | B1 | | 1/2012 | |
| KR | 1020130070559 | A | | 6/2013 | |
| KR | 1020140032819 | A | | 3/2014 | |
| KR | 1020140061807 | A | | 5/2014 | |
| TW | 200612772 | A | | 4/2006 | |
| TW | 200812424 | A | | 3/2008 | |
| TW | 200937045 | A | | 9/2009 | |
| TW | 201000971 | A1 | | 1/2010 | |

OTHER PUBLICATIONS

Machine translation, Ibuki, Korean Pat. Pub. No. 10-2018-0005612, translation date: May 1, 2019, Espacenet, all pages. (Year: 2019).*
Machine translation, Hosoya, Japanese Pat. Pub. No. 2009-259504, translation date: May 4, 2019, Espacenet, all pages. (Year: 2019).*
Written Opinion of the International Searching Authority, PCT App. No. PCT/KR2017/002424, dated May 31, 2017, all pages. (Year: 2017).*
Machine translation, Tetsuro, Japanese Pat. Pub. No. 2004-063303, translation date: Apr. 30, 2019, Espacenet, all pages. (Year: 2019).*
Machine translation, Ryu, Korean Pat. Pub. No. 10-2005-0076464, translation date: Apr. 30, 2019, Espacenet, all pages. (Year: 2019).*
Machine translation, Kikuchi, Japanese Pat. Pub. No. H7-335134, translation date: Apr. 30, 2019, Espacenet, all pages. (Year: 2019).*
Machine translation, Fukushige, Japanese Pat. Pub. No. 2008-310286, translation date: Apr. 30, 2019, Espacenet, all pages. (Year : 2019).*
Machine translation, Notification of Reason for Refusal, KIPO, dated Jan. 21, 2019, all pages. (Year: 2019).*
Machine translation, Hanaoka, Japanese Pat. Pub. No. 2001-159712, translation dateL Apr. 30, 2019, Espacenet, all pages. (Year: 2019).*
Machine translation, Notification of Reasons for Refusal, JPO, dated Dec. 6, 2018, all pages. (Year: 2018).*

* cited by examiner

[Figure 1]
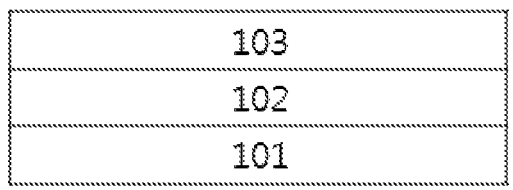
[Figure 2]
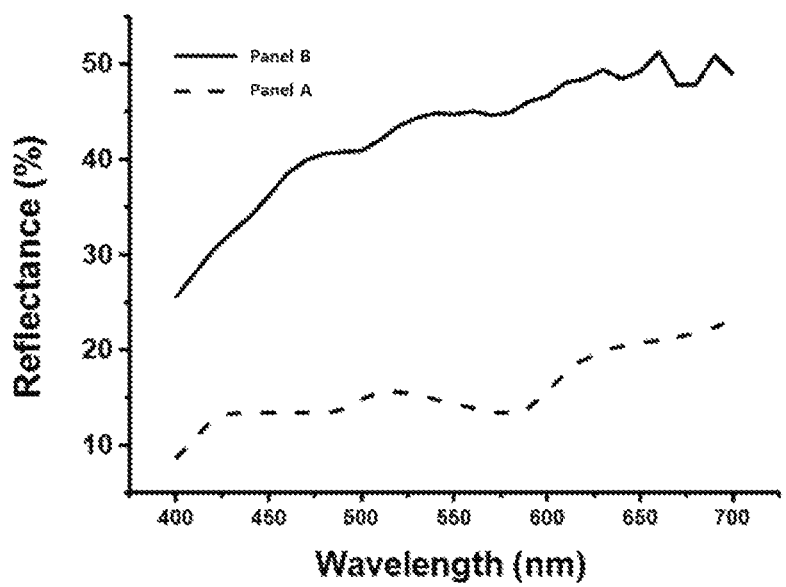

[Figure 3]
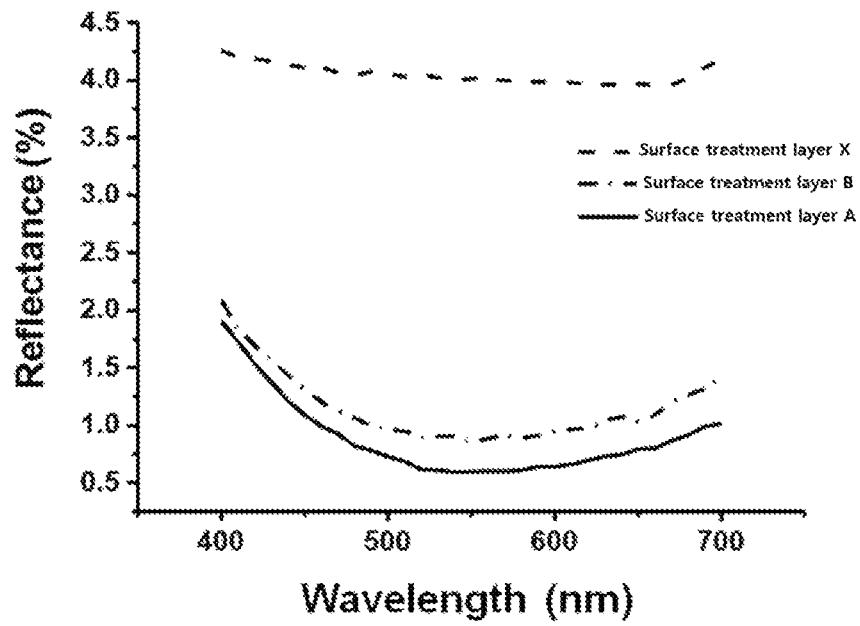
[Figure 4]
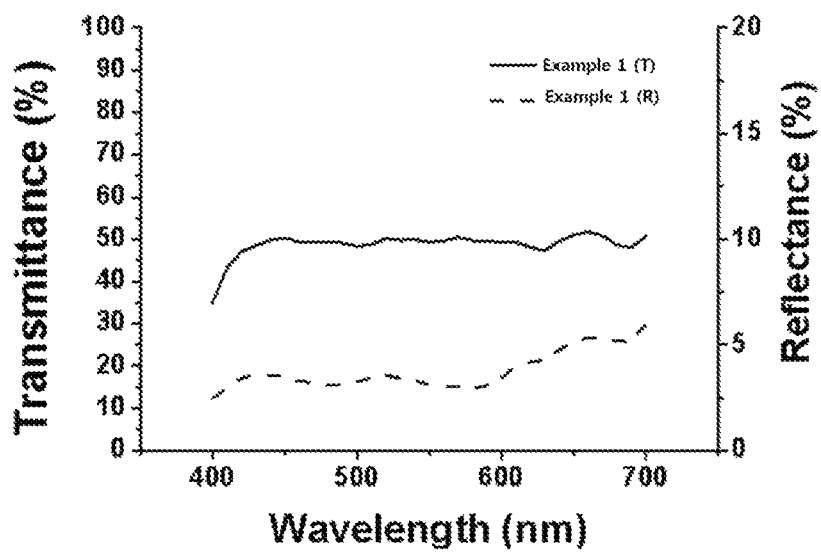

[Figure 5]
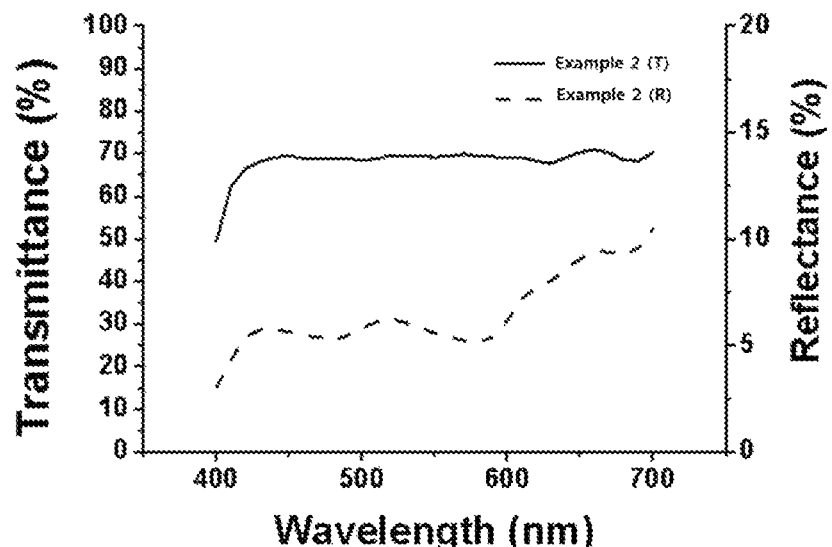
[Figure 6]
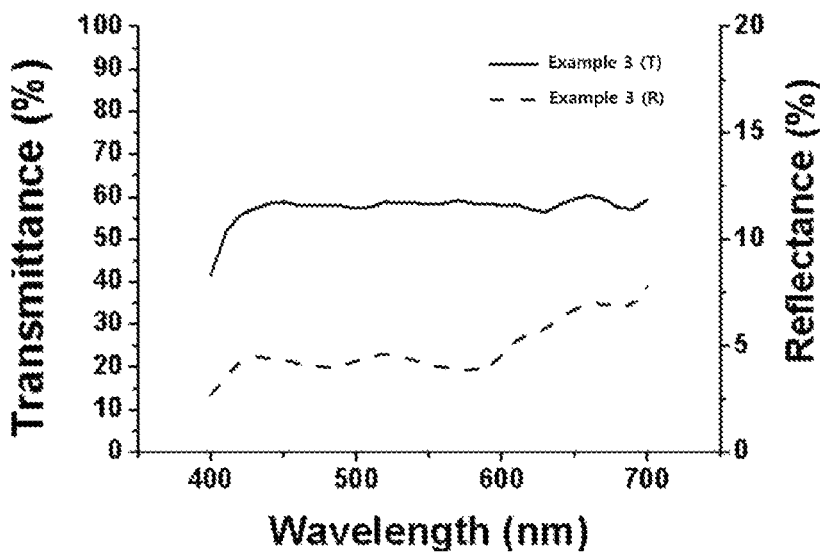

[Figure 7]
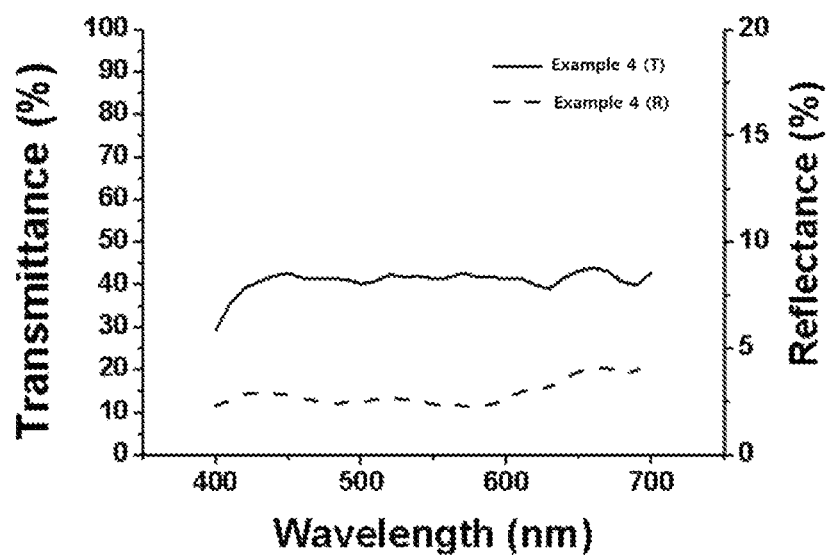
[Figure 8]
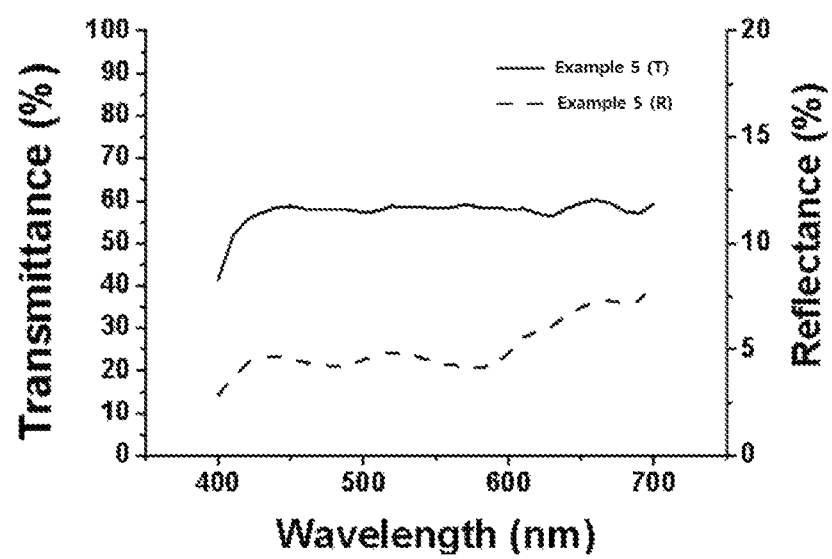

[Figure 9]
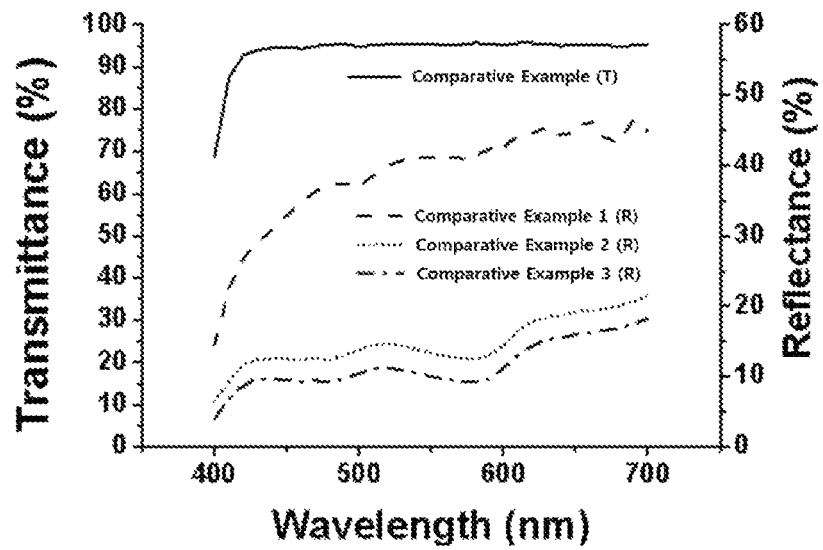
[Figure 10]
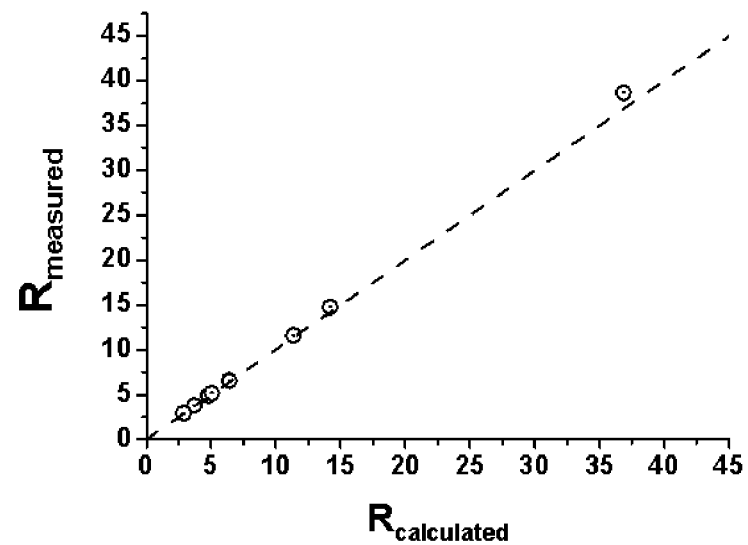

DISPLAY DEVICE

TECHNICAL FIELD

The present application relates to a display device.

This application is a National Stage Application of International Application No. PCT/KR2017/002424, filed Mar. 7, 2017, and claims the benefit of Korean Patent Application No. 10-2016-0027595, filed Mar. 8, 2016, contents of which are incorporated herein by reference in their entirety for all purposes as if fully set forth below.

BACKGROUND ART

An organic electroluminescence device (OLED) is a self-luminous display device and requires no backlight, and thus has an advantage capable of being lightweight and thin.

However, there is a disadvantage that the OLED panel causes reflection due to external light by metal wiring or electrodes to greatly reduce a contrast ratio.

Patent Document 1 (Japanese Unexamined Patent Publication No. 2014-186351) discloses a technique of attaching a circular polarizing plate to an OLED panel in order to prevent a decrease in the contrast ratio due to reflection of external light. According to Patent Document 1, external light incident from the outside enters through the circular polarizing plate, and the incident external light is reflected by the second electrode made of metal to change its polarization direction. Therefore, the incident external light does not transmit through the circular polarizing plate and does not emit to the outside, thereby causing extinction interference. As a result, by blocking external light to be reflected, the contrast ratio is improved.

However, when the circular polarizing plate is used, there is a problem that the luminance of the display is greatly reduced to 50% or less. In addition, as the display device gradually evolves into a bendable or foldable flexible display device, there is a limitation to use a circular polarizing plate by attaching it to an OLED panel, for a reason of deterioration in the performance appearing in areas where the curvature of the circular polarizing plate is large due to bending and folding.

DETAILED DESCRIPTION OF THE INVENTION

Technical Problem

It is a problem to be solved by the present application to provide a display device in which reflection of external light is reduced to improve a contrast ratio.

Technical Solution

The present application relates to a display device for solving the above problem. The display device may comprise a display panel, a pressure-sensitive adhesive layer, and a surface treatment layer. FIG. 1 exemplarily shows a display device comprising a display panel (101), a pressure-sensitive adhesive layer (102) and a surface treatment layer (103) in sequence.

In one example, the display device may have a reflectance ($R_C$) of 10% or less calculated by Equation 1 below. Such a display device can reduce reflection of external light to improve the contrast ratio.

$$R_C = R_S + \left(1 - \frac{R_S}{100}\right) \times (R_P - 4) \times \left(\frac{T}{100}\right)^2 \quad \text{[Equation 1]}$$

In Equation 1, $R_S$ is the reflectance (%) of the surface treatment layer for light having a wavelength of 550 nm, $R_P$ is the reflectance (%) of the display panel for light having a wavelength of 550 nm, and T is the total transmittance (%) of the pressure-sensitive adhesive layer and the surface treatment layer for light having a wavelength of 550 nm.

More specifically, the display device may have a reflectance (RC), of 10% or less, 9% or less, 8% or less or 7% or less, calculated by Equation 1 above.

In one example, the display device may satisfy Equation 2 below.

$$\frac{(R_M - R_C)}{R_M} \times 100 \le 3 \quad \text{[Equation 2]}$$

In Equation 2, $R_M$ is the reflectance of the display panel equipped with the pressure-sensitive adhesive layer and the surface treatment layer measured for light having a wavelength of 550 nm, and $R_C$ is a reflectance $R_C$ calculated by Equation 1. The reflectance ($R_M$) may mean a reflectance measured at the surface treatment layer side of the display device.

The reflectance $R_C$ calculated by Equation 1 can have a deviation within about 3% with respect to the reflectance measured value $R_M$. Therefore, when the reflectance $R_C$ calculated by Equation 1 is designed to be low in the display device, the actually measured reflectance $R_M$ can be lowered.

That is, the present application can provide the relationship between the reflectance of the surface treatment layer, the reflectance of the display panel, and the total transmittance of the pressure-sensitive adhesive layer and the surface treatment layer for lowering the actually measured reflectance, as shown in Equation 1, and reduce the external light reflectance of the display panel by regulating the reflectance $R_C$ calculated by Equation 1.

The display panel may comprise a self-luminous display panel or a non-self-luminous display panel. As the self-luminous display panel, for example, an OLED panel which does not require a backlight, and the like can be exemplified, and as the non-self-luminous display panel, for example, an LCD panel which requires a backlight, and the like can be exemplified. According to one embodiment of the present invention, the OLED panel may be used as the display panel, without being limited thereto.

A low reflection panel may be used as the display panel. In one example, the reflectance ($R_P$) of the display panel may be 5% to 20%.

The display panel may be equipped with an antireflection layer. The antireflection layer may be provided on the light emitting surface layer of the display device. The antireflection layer may include a thin film transistor and a gate line and a data line. The antireflection layer may be provided on a non-pixel area comprising a thin film transistor and a wiring portion comprising a gate line and a data line. Such an antireflection layer may serve to prevent reflection of light in the surface of the wiring electrode of the thin film transistor and the wiring portion comprising the gate line and the data line provided on the non-pixel area. When external light is incident on the antireflection layer, a primary reflection light reflected from the surface of the antireflection layer is present, and a secondary reflection light reflected from the lower wiring portion via the antireflection layer is present. The thickness of the antireflection layer may be adjusted to 10 nm to 100 nm. When the thickness of the antireflection layer is within the range, the light reflectance is effectively lowered through extinction interference of the primary reflection light and the secondary reflection light, so that such a display panel is advantageous for realizing the reflectance $R_P$.

The antireflection layer may comprise a metal oxide, a metal nitride or a metal oxynitride derived from one or two or more metals selected from the group consisting of Cu, Al, Mo, Ti, Ag, Ni, Mn, Au, Cr and Co.

The pressure-sensitive adhesive layer and the surface treatment layer may be sequentially provided on the visual side of the display panel. Therefore, the display device can solve the problem that external light is reflected to the visual side. The display panel may be formed by sequentially laminating a pressure-sensitive adhesive layer and a surface treatment layer on the upper surface of the display panel.

The total transmittance T of the pressure-sensitive adhesive layer and the surface treatment layer may be 30% to 80%. The total transmittance T may be more specifically 40% to 70% or 50% to 60%. When the total transmittance T is within the above range, the reflectance due to external light can be effectively reduced. The total transmittance may mean a transmittance for the light having a wavelength of about 550 nm measured in a state equipped together with the pressure-sensitive adhesive layer and the surface treatment layer, for example, in a state where the pressure-sensitive adhesive layer and the surface treatment layer are laminated. In addition, the total transmittance may mean a transmittance value measured by allowing light to first enter the surface treatment layer among the laminated pressure-sensitive adhesive layer and the surface treatment layer.

The pressure-sensitive adhesive layer may comprise a pressure-sensitive adhesive resin and a light absorbing material. The light absorbing material may comprise a dye or pigment. As the pressure-sensitive adhesive resin, for example, a pressure-sensitive adhesive resin, such as a styrenic resin or elastomer, a polyolefin resin or elastomer, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluororesin or elastomer, or a mixture thereof, may be used.

The dye or pigment may be a mixture of three or more dyes or pigments with different maximum absorption wavelength bands. As an example, the dye or pigment may be a mixture of three or more dyes or pigments that the maximum absorption wavelength bands correspond to the R (Red) region, the G (Green) region and the B (Blue) region, respectively. However, the kind of the dye or pigment is not limited to the above, but can be suitably adjusted so as to be capable of exhibiting a flat transmittance spectrum in the visible light region. For example, the dye or pigment may be also a mixture of dyes or pigments whose maximum absorption wavelength bands are in R (Red), G (Green), Y (Yellow) and V (Violet) regions, respectively. As described above, the mixture of the dyes or pigments may exhibit a generally stable and flat transmittance spectrum. As an example, the mixture of the dyes or pigments may exhibit a transmittance spectrum in which a standard deviation of the total transmittance of the pressure-sensitive adhesive layer and the surface treatment layer at a wavelength of 400 nm to 700 nm is 5 or less. The total transmittance may mean an average transmittance for a wavelength of 400 nm to 700 nm measured in a state equipped together with the pressure-sensitive adhesive layer and the surface treatment layer. The standard deviation may mean a deviation of the wavelength band of 400 nm to 700 nm for the average transmittance.

The pressure-sensitive adhesive layer may comprise 0.1 to 3 parts by weight of a dye or pigment relative to 100 parts by weight of the pressure-sensitive adhesive resin. Such a pressure-sensitive adhesive layer can effectively exhibit the total transmittance T of the pressure-sensitive adhesive layer and the surface treatment layer. In the present specification, the part by weight may mean a weight ratio in each of components.

The pressure-sensitive adhesive layer may further comprise an antistatic agent. As the antistatic agent, for example, an ionic compound or a metal salt can be used. As the ionic compound, for example, a known organic salt usable as the antistatic agent can be used. As the metal salt, for example, a known alkali metal salt or alkaline earth metal salt usable as the antistatic agent can be used. In the case of further comprising the antistatic agent, the pressure-sensitive adhesive layer may have an antistatic property to reduce generation of static electricity, and the like.

The reflectance $R_S$ of the surface treatment layer may be 0.5% to 2%. The reflectance $R_S$ of the surface treatment layer may be, more specifically, 0.7% to 1.8%, or 0.9% to 1.6%. When the reflectance $R_S$ of the surface treatment layer is within the above range, the reflectance due to external light can be effectively reduced.

The surface treatment layer may be, for example, an antireflection layer or an anti-glare layer. The surface treatment layer may comprise a low refractive index layer exhibiting a refractive index of about 1.4 or less for a wavelength of 550 nm. The lower limit of the refractive index in the low refractive index layer may be, for example, about 1.2 or more, and the more specific refractive index range may be 1.31 to 1.35. The low refractive index layer may comprise a fluorine-based acrylate and a photo-curable acrylate comprising hollow silica. Such a surface treatment layer is advantageous for realizing the reflectance $R_S$. The surface treatment layer may further comprise a hard coating layer on one surface of the low refractive index layer.

The display device of the present application can reduce reflection of external light to improve the contrast ratio. Such a display device can be applied to not only OLED, a self-luminous display device, but also various display devices including LCD, a non-self-luminous display device, and the like, and can be also implemented as a flexible display device.

Effects of the Invention

The present application can provide a display device in which reflection of external light is reduced to improve the contrast ratio. Such a display device can be applied to not only OLED, a self-luminous display device, but also various display devices including LCD, a non-self-luminous display device, and the like, and can be also implemented as a flexible display device.

BRIEF DESCRIPTION OF DRAWINGS

FIG. 1 is a schematic diagram showing a display device of the present application.

FIG. 2 is reflectance graphs of panels according to wavelengths.

FIG. 3 is reflectance graphs of surface treatment layers according to wavelengths.

FIG. 4 is graphs of transmittance and reflectance according to wavelengths in Example 1.

FIG. 5 is graphs of transmittance and reflectance according to wavelengths in Example 2.

FIG. 6 is graphs of transmittance and reflectance according to wavelengths in Example 3.

FIG. 7 is graphs of transmittance and reflectance according to wavelengths in Example 4.

FIG. 8 is graphs of transmittance and reflectance according to wavelengths in Example 5.

FIG. 9 is graphs of transmittance and reflectance according to wavelengths in Comparative Examples 1 to 3.

FIG. 10 is a comparative graph of reflectance measured value $R_M$ and calculated value $R_C$.

MODE FOR THE INVENTION

Hereinafter, the display device will be described in more detail through examples according to the present application, and the like, but the scope of the present application is not limited to the following.

1. Measurement of Transmittance and Reflectance

In the following Examples and Comparative Examples, transmittance and reflectance according to wavelengths were measured according to the manufacturer's manual using a UV-VIS-NIR Spectrophotometer (solidspec-3700, Shimadzu).

2. Calculation of Reflectance $R_C$

In the following Examples and Comparative Examples, the reflectance ($R_C$) was calculated according to Equation 1 below.

$$R_C = R_S + \left(1 - \frac{R_S}{100}\right) \times (R_P - 4) \times \left(\frac{T}{100}\right)^2 \quad \text{[Equation 1]}$$

In Equation 1, $R_S$ is the reflectance (%) of the surface treatment layer for light having a wavelength of 550 nm, $R_P$ is the reflectance (%) of the display panel for light having a wavelength of 550 nm, and T is the total transmittance (%) of the pressure-sensitive adhesive layer and the surface treatment layer for light having a wavelength of 550 nm.

Panels, pressure-sensitive adhesive layers and surface treatment layers used in Examples and Comparative Examples were prepared as follows.

Panels A to B

A low reflection panel (panel A) having a reflectance of 15.95% for light with a wavelength of 550 nm was prepared by forming $AlO_{0.3}N_{0.8}$ having a thickness of 80 nm (±20 nm) as an antireflection layer on the upper surface of the non-pixel area by a reactive sputtering method.

A high reflection panel (panel B) having a reflectance of 42.68% for light having a wavelength of 550 nm was prepared without forming an antireflection layer on the upper surface of the non-pixel area in the panel.

FIG. 2 is reflectance graphs of panels A and B according to wavelengths.

Pressure-Sensitive Adhesive Layer A

Preparation of Pressure-Sensitive Adhesive Polymer Solution (A)

n-Butyl acrylate (BA) and 2-hydroxyethyl acrylate (2-HEA) were added in a weight ratio of 99:1 (BA:HBA) to an 1 L reactor refluxing nitrogen gas and equipped with a cooling device to facilitate temperature control, and ethyl acetate was added as a solvent. Subsequently, nitrogen gas was purged for 1 hour to remove oxygen and a reaction initiator (AIBN; azobisisobutyronitrile) was added to allow reaction for about 8 hours, and then the reactant was diluted with ethyl acetate to prepare a pressure-sensitive adhesive polymer (A). The weight average molecular weight (Mw) of the pressure-sensitive adhesive polymer (A) was about 1.8 million.

Preparation of Pressure-Sensitive Adhesive Layer A

An ionic compound (FC-4400, 3M Co.) was mixed with the prepared pressure-sensitive adhesive polymer solution (A) in the ratio of about 1 part by weight relative to 100 parts by weight of the solid content of the pressure-sensitive adhesive polymer solution (A), and about 0.083 parts by weight of an isocyanate curing agent (T-39M, Soken) as a cross-linking agent and 8 ppm of a catalyst (dibutyl tin dilaurate, DBTDL) were mixed in a solvent (EAc, ethyl acetate), relative to 100 parts by weight of the solid content. And, Red S-A2G, Yellow S-BY, Violet V-IRS, Red S-3G and Green S-6G (Yedham Chemical) as dyes were mixed in a ratio of about 0.22, 0.1, 0.19, 0.23, and 0.08 parts by weight relative to 100 parts by weight of the solid content to prepare a cross-linkable composition. The prepared cross-linkable composition was coated on the release-treated surface of the release-treated PET (poly(ethyleneterephthalate) (MRF-38, manufactured by Mitsubishu)) film and dried at a temperature of 100° C. or more for 2 minutes or more to prepare a pressure-sensitive adhesive layer A.

Pressure-Sensitive Adhesive Layer B

A pressure-sensitive adhesive layer B was prepared in the same manner as the Preparation of Pressure-sensitive Adhesive Layer A, except that a mixture of Red S-A2G, Yellow S-BY, Violet V-IRS, Red S-3G and Green S-6G (Yedham Chemical) as dyes was used in a ratio of about 0.1, 0.05, 0.09, 0.11 and 0.04 parts by weight relative to the solid content of the pressure-sensitive adhesive polymer solution (A).

Pressure-Sensitive Adhesive Layer C

A pressure-sensitive adhesive layer C was prepared in the same manner as the Preparation of Pressure-sensitive Adhesive Layer A, except that a mixture of Red S-A2G, Yellow S-BY, Violet V-IRS, Red S-3G and Green S-6G (Yedham Chemical) as dyes was used in a ratio of about 0.17, 0.07, 0.14, 0.17 and 0.06 parts by weight relative to the solid content of the pressure-sensitive adhesive polymer solution (A).

Pressure-Sensitive Adhesive Layer D

A pressure-sensitive adhesive layer D was prepared in the same manner as the Preparation of Pressure-sensitive Adhesive Layer A, except that a mixture of Red S-A2G, Yellow S-BY, Violet V-IRS, Red S-3G and Green S-6G (Yedham Chemical) as dyes was used in a ratio of about 0.28, 0.12, 0.24, 0.29 and 0.11 parts by weight relative to the solid content of the pressure-sensitive adhesive polymer solution (A).

Pressure-Sensitive Adhesive Layer E

A pressure-sensitive adhesive layer E was prepared in the same manner as the Preparation of Pressure-sensitive Adhesive Layer A, except that a mixture of Red S-A2G, Yellow S-BY, Violet V-IRS, Red S-3G and Green S-6G (Yedham Chemical) as dyes was used in a ratio of about 0.17, 0.07, 0.14, 0.17 and 0.06 parts by weight relative to the solid content of the pressure-sensitive adhesive polymer solution (A).

Pressure-Sensitive Adhesive Layer F

A pressure-sensitive adhesive layer F was prepared in the same manner as the Preparation of Pressure-sensitive Adhesive Layer A, except for using no dye.

Surface Treatment Layers A to B

An antistatic hard coating solution (solid content 50% by weight, product name: LJD-1000) of a salt type of KYOE-ISHA was coated on the upper surface of a TAC film with a #10 mayer bar, dried at 90° C. for 1 minute, and then irradiated with 150 mJ/cm² of ultraviolet to prepare a hard coating film having a thickness of about 5 to 6 μm. A surface treatment layer A having a reflectance of 0.89% and a surface treatment layer B having a reflectance of 1.14% for light having a wavelength of 550 nm were prepared through an antireflective layer coated with a low refractive index layer having a refractive index of about 1.33 at 550 nm made of a photo-curable acrylate and a fluorine-based acrylate containing 60% by weight and 40% by weight of hollow silica, respectively.

When the surface treatment layer is not formed on the upper surface of the TAC film, the reflectance for light with a wavelength of 550 nm is 4.05%.

FIG. 3 is reflectance graphs of the surface treatment layers A to B and the case, in which the surface treatment layer is not performed, according to wavelengths.

EXAMPLE 1

A display device was manufactured by laminating a pressure-sensitive adhesive surface of a film, in which the pressure-sensitive adhesive layer A and the surface treatment layer A were laminated, on the upper surface of a low reflection panel (panel A).

EXAMPLES 2 TO 5 AND COMPARATIVE EXAMPLES 1 TO 3

Examples 2 to 5 and Comparative Examples 1 to 3 were manufactured in the same manner as in Example 1, except that panels, pressure-sensitive adhesive layers and surface treatment layers were changed as shown in Table 1 below.

TABLE 1

| | Panel | Pressure-sensitive adhesive layer | Surface treatment layer |
|---|---|---|---|
| Example 1 | A | A | A |
| Example 2 | A | B | A |
| Example 3 | A | C | A |
| Example 4 | A | D | A |
| Example 5 | A | E | B |
| Comparative Example 1 | B | F | — |
| Comparative Example 2 | A | F | — |
| Comparative Example 3 | A | F | A |

Physical properties ($R_S$, $R_P$, T, $R_M$ and $R_C$) of Examples 1 to 5 and Comparative Examples 1 to 3 were shown in Table 2. FIGS. 4 to 8 are graphs of transmittance and reflectance according to wavelengths in Examples 1 to 5, respectively. FIG. 9 is graphs of transmittance and reflectance according to wavelengths in Comparative Examples 1 to 3. FIG. 10 is a comparative graph of reflectance measured value $R_M$ and calculated value $R_C$.

TABLE 2

| | $R_S$ | $R_P$ | T | $R_M$ | $R_C$ |
|---|---|---|---|---|---|
| Comparative Example 1 | 4.05 | 42.68 | 94.0 | 38.66 | 36.84 |
| Comparative Example 2 | 4.05 | 15.95 | 94.0 | 14.77 | 14.18 |
| Comparative Example 3 | 4.05 | 15.95 | 94.0 | 11.60 | 11.35 |
| Example 1 | 0.89 | 15.95 | 48.8 | 3.78 | 3.70 |
| Example 2 | 0.89 | 15.95 | 68.3 | 6.55 | 6.40 |
| Example 3 | 0.89 | 15.95 | 57.4 | 4.89 | 4.79 |
| Example 4 | 0.89 | 15.95 | 40.9 | 2.92 | 2.87 |
| Example 5 | 1.14 | 15.95 | 57.4 | 5.16 | 5.04 |

$R_S$: reflectance (%) of the surface treatment layer for light with a wavelength of 550 nm
$R_P$: reflectance (%) of the display panel for light with a wavelength of 550 nm
T: total transmittance (%) of the pressure-sensitive adhesive layer and the surface treatment layer for light with a wavelength of 550 nm
$R_M$: reflectance (%) of the display device for light with a wavelength of 550 nm
$R_C$: reflectance (%) calculated by Equation 1

DESCRIPTION OF SYMBOLS

101: Display panel 102: Pressure sensitive adhesive layer 103: Surface treatment layer

The invention claimed is:

1. A display device comprising a display panel, a pressure-sensitive adhesive layer, and a surface treatment layer, and having a reflectance ($R_C$) calculated by Equation 1 below of 10% or less,
wherein the pressure-sensitive adhesive layer comprises a pressure-sensitive adhesive resin and a dye or pigment:

$$R_C = R_S + \left(1 - \frac{R_S}{100}\right) \times (R_P - 4) \times \left(\frac{T}{100}\right)^2 \quad \text{[Equation 1]}$$

wherein, $R_S$ is the reflectance (%) of the surface treatment layer for light having a wavelength of 550 nm, $R_P$ is the reflectance (%) of the display panel for light having a wavelength of 550 nm, and T is the total transmittance (%) of the pressure-sensitive adhesive layer and the surface treatment layer for light having a wavelength of 550 nm.

2. The display device according to claim 1, satisfying Equation 2 below:

$$\frac{(R_M - R_C)}{R_M} \times 100 \leq 3 \quad \text{[Equation 2]}$$

wherein, $R_M$ is the reflectance (%) of the display panel equipped with the pressure-sensitive adhesive layer and the surface treatment layer measured for light having a wavelength of 550 nm, and $R_C$ is a reflectance $R_C$ calculated by Equation 1.

3. The display device according to claim 1, wherein the display panel comprises a self-luminous display panel or a non-self-luminous display panel.

4. The display device according to claim 1, wherein the reflectance $R_P$ of the display panel is 5% to 20%.

5. The display device according to claim 1, wherein the display panel is equipped with an antireflection layer on a non-pixel region comprising a thin film transistor and a wiring portion comprising a gate line and a data line.

6. The display device according to claim 5, wherein the antireflection layer comprises a metal oxide, a metal nitride or a metal oxynitride derived from one or two or more metals selected from the group consisting of Cu, Al, Mo, Ti, Ag, Ni, Mn, Au, Cr, and Co.

7. The display device according to claim 5, wherein the thickness of the antireflection layer is 10 nm to 100 nm.

8. The display device according to claim 1, wherein the pressure-sensitive adhesive layer and the surface treatment layer are sequentially provided on the visual side of the display panel.

9. The display device according to claim 1, wherein the total transmittance T of the pressure-sensitive adhesive layer and the surface treatment layer is 30% to 80%.

10. The display device according to claim 1, wherein the pressure-sensitive adhesive resin comprises a styrenic resin or elastomer, a polyolefin resin or elastomer, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluororesin or elastomer, or a mixture thereof.

11. The display device according to claim 1, wherein the dye or pigment is a mixture of three or more dyes or pigments having different maximum absorption wavelength bands from one another and has a standard deviation of the total transmittance of the pressure-sensitive adhesive layer and the surface treatment layer at a wavelength of 400 nm to 700 nm of 5 or less.

12. The display device according to claim 1, wherein the pressure-sensitive adhesive layer comprises 0.1 to 3 parts by weight of a dye or pigment relative to 100 parts by weight of the pressure-sensitive adhesive resin.

13. The display device according to claim 1, wherein the pressure-sensitive adhesive layer further comprises an antistatic agent.

14. The display device according to claim 1, wherein the reflectance $R_S$ of the surface treatment layer is 0.5% to 2%.

15. The display device according to claim 1, wherein the surface treatment layer comprises an antireflection layer or an anti-glare layer.

16. The display device according to claim 1, wherein the surface treatment layer comprises a low refractive index layer having a refractive index of 1.2 to 1.4 for a wavelength of 550 nm.

17. The display device according to claim 16, wherein the low refractive index layer comprises a fluorine-based acrylate and a photo-curable acrylate containing hollow silica.

18. The display device according to claim 16, wherein the surface treatment layer further comprises a hard coating layer provided on one surface of the low refractive index layer.

* * * * *